United States Patent
Bond et al.

[11] Patent Number: 5,991,156
[45] Date of Patent: Nov. 23, 1999

[54] BALL GRID ARRAY INTEGRATED CIRCUIT PACKAGE WITH HIGH THERMAL CONDUCTIVITY

[75] Inventors: Robert H. Bond, Plano; Michael J. Hundt, Double Oak, both of Tex.

[73] Assignee: STMicroelectronics, Inc., Carrollton, Tex.

[21] Appl. No.: 08/225,138

[22] Filed: Apr. 8, 1994

Related U.S. Application Data

[63] Continuation-in-part of application No. 08/170,613, Dec. 20, 1993, abandoned.

[51] Int. Cl.$^6$ ........................................... H05K 7/20
[52] U.S. Cl. ..................... 361/707; 174/16.3; 257/713; 361/719
[58] Field of Search ................... 174/16.3; 257/706–707, 257/711–712, 717, 693, 720; 361/704, 707–722, 792

[56] References Cited

U.S. PATENT DOCUMENTS

| | | | |
|---|---|---|---|
| 5,157,480 | 10/1992 | McShane et al. | 357/74 |
| 5,172,301 | 12/1992 | Schneider | 361/704 |
| 5,222,014 | 6/1993 | Lin | 361/792 |
| 5,285,352 | 2/1994 | Pasture et al. | 361/707 |
| 5,291,062 | 3/1994 | Higgins, III | 257/702 |
| 5,311,402 | 5/1994 | Kobayashi et al. | 361/707 |

FOREIGN PATENT DOCUMENTS

| | | | |
|---|---|---|---|
| 2609841 | 6/1988 | France . | |
| 2058358 | 2/1990 | Japan | 257/712 |
| 3198368 | 8/1991 | Japan | 257/717 |

*Primary Examiner*—Gregory Thompson
*Attorney, Agent, or Firm*—David V. Carlson; Theodore E. Galanthay; Lisa K. Jorgenson

[57] ABSTRACT

An integrated circuit package with a path of high thermal conductivity is disclosed. A thermally conductive slug, formed of a material such as copper, is attached to an underside portion of a substrate, such as a printed circuit board or a ceramic substrate, through which an opening has been formed. An integrated circuit chip is mounted to one side of the slug exposed in the opening. An opposing surface of the slug lies below the plane of the underside of the substrate. The chip is wire bonded to the substrate, and is encapsulated in the conventional manner. Solder balls are attached to a portion of the underside of the substrate not covered by the slug in a ball-grid-array manner, for mounting to a circuit board. Upon mounting to the circuit board, a path of high thermal conductivity is provided between the chip and the circuit board, through the slug and the solder balls.

10 Claims, 2 Drawing Sheets

BALL GRID ARRAY INTEGRATED CIRCUIT PACKAGE WITH HIGH THERMAL CONDUCTIVITY

This is a continuation-in-part of application Ser. No. 08/170,613, filed Dec. 20, 1993 now abandoned, assigned to SGS-Thomson Microelectronics, Inc. and incorporated herein by this reference.

FIELD OF THE INVENTION

The present invention relates generally to semiconductor integrated circuit device packages, and is more particularly directed to thermal conduction techniques.

BACKGROUND OF THE INVENTION

Advances continue to be made in the manufacture of solid-state electronic devices, resulting in increasing functionality, density and performance of the integrated circuits. The amount of heat generated, and accordingly the amount of power needed to be dissipated, by modern integrated circuits generally increases with increases in the density and speed of the circuits. Removal of heat produced by the integrated circuits therefore continues to be of significant concern of modern integrated circuit package and system designers, considering the loss of performance and the degradation in reliability of integrated circuits when operated at elevated temperatures.

In addition, the trend toward more compact electronic systems is also continuing, exacerbating the thermal problem produced by the high-complexity and high-performance integrated circuits. For example, laptop or notebook sized computers have recently become quite popular, with continuing market pressure toward even smaller computer systems such as personal digital assistants (PDA). However, these small systems eliminate many of the traditional techniques for heat removal available for large-scale computer systems, such as the use of fans for convection cooling of the integrated circuits. As such, many modern systems utilize thermal conduction as the primary mode of heat removal from the integrated circuits in the system.

Integrated circuit packages of the ball-grid-array (BGA) type have recently become popular in the field. Conventional BGA packages are similar in layout and arrangement to the pin-grid-array (PGA) packages, in providing a rectangular or square array of connections on the underside of the integrated circuit package. Instead of the pin connectors used in PGA packages, however, BGA packages utilize a solder ball located at each connector location. As is known in the art, the BGA package is attached to a printed circuit board by reflowing the solder balls to make connection to conductors at the surface of the printed circuit board. The BGA package provides the important advantage of being self-aligning, as the surface tension of the solder will tend to pull the BGA package into proper alignment with the corresponding conductors on the printed circuit board.

By way of further background, BGA integrated circuit packages of various types are known, including those of both the "cavity-up" and the "cavity-down" type. Conventional cavity-up BGA packages mount the integrated circuit chip with the circuitry facing up into a cavity (or onto the surface) of the package substrate, attach wire bonds between the package and the chip on its top side, and then either transfer mold or otherwise dispense a plastic over the chip and bond wires to provide environmental protection to the chip and wires. The solder balls are provided on the side of the substrate opposite the chip, and the packaged chip is then mounted to the system printed circuit board. It is known to use plated vias through the substrate at locations underlying the chip, but that are offset from conductors on the printed circuit board to which the packaged chip is mounted, to provide thermal conduction from the chip to its external environment.

Conventional cavity-down integrated circuit packages mount the integrated circuit chip into the cavity of, or onto the surface of, the package substrate, followed by attachment of bond wires thereto and molding or otherwise dispense a plastic around the chip. In this type of package, the solder balls are provided on the same side of the substrate as the chip, so that the chip is disposed up-side down or with the circuitry of the integrated circuit facing down after attachment of the packaged chip to the circuit board. It is known to mount the chip to a thermally conductive slug disposed within the substrate of a cavity-down package, with the slug exposed on its opposite side from the chip after mounting. A heat sink may be mounted to the exposed upper surface of the slug, so that the heat sink extends upwardly and facilitates convection cooling. This arrangement is not particularly well suited for modern small computing systems, such as laptop, notebook-sized, or hand-held computers, as these systems are not able to house a fan, and indeed are designed to have little or no flow of air within the housing ("zero-air-flow"), relying instead on conduction and natural convection heat transfer.

It is therefore an object of the present invention to provide an integrated circuit package having improved thermal conduction from the packaged chip to the system circuit board upon which it is mounted.

It is a further object of the present invention to provide such a package which is arranged in the cavity-up orientation.

It is a further object of the present invention to provide such a package that is of the ball-grid-array (BGA) type.

It is a further object of the present invention to provide such a package that reduces the need for convection cooling.

Other objects and advantages of the present invention will be apparent to those of ordinary skill in the art having reference to the following specification together with its drawings.

SUMMARY OF THE INVENTION

The invention may be implemented in a ball-grid-array (BGA) package of the cavity-up orientation. A thermally conductive slug, for example, made of copper, is attached to a package substrate having an opening therethrough; the substrate itself may be formed of a printed circuit board or ceramic substrate. A first surface of the slug lies below the plane of a first or underside surface of the substrate. A portion of a second surface of the slug is attached to the underside of the substrate. The integrated circuit chip is attached to the slug in the opening, and bonds are made between the bond pads of the chip and the package conductors, followed by encapsulation of the chip by molding or dispensing of a plastic. Solder balls are attached to the underside of the substrate package around the slug at locations corresponding to the terminals of the package. Upon attachment to the system circuit board, thermal and electrical connection is made between the slug and the system circuit board, along with electrical connection of the solder ball connectors to their respective system circuit board terminals. The slug thus provides direct thermal conduction between the chip and the system circuit board, to take advantage of the thermal conductivity of the system circuit board in conducting heat away from the chip.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

Figure 1A:
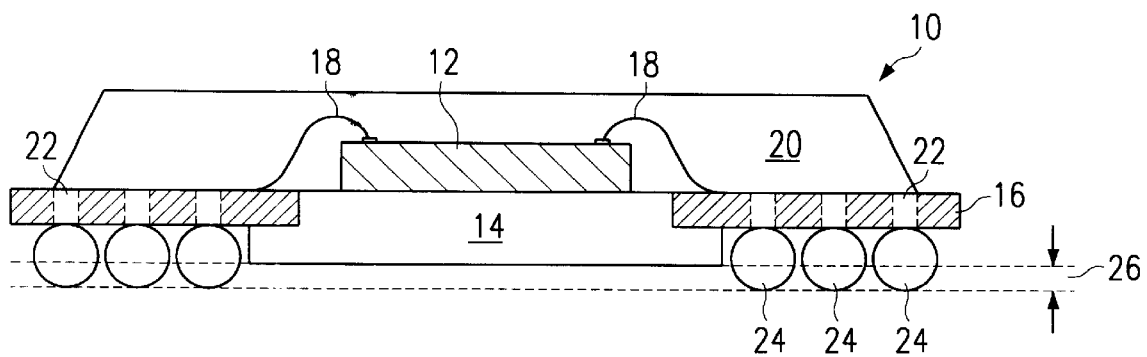
FIGS. 1A, 2A and 2B are cross sectional illustrations of an integrated circuit package according to the preferred embodiment of the present invention.
Figure 1B:
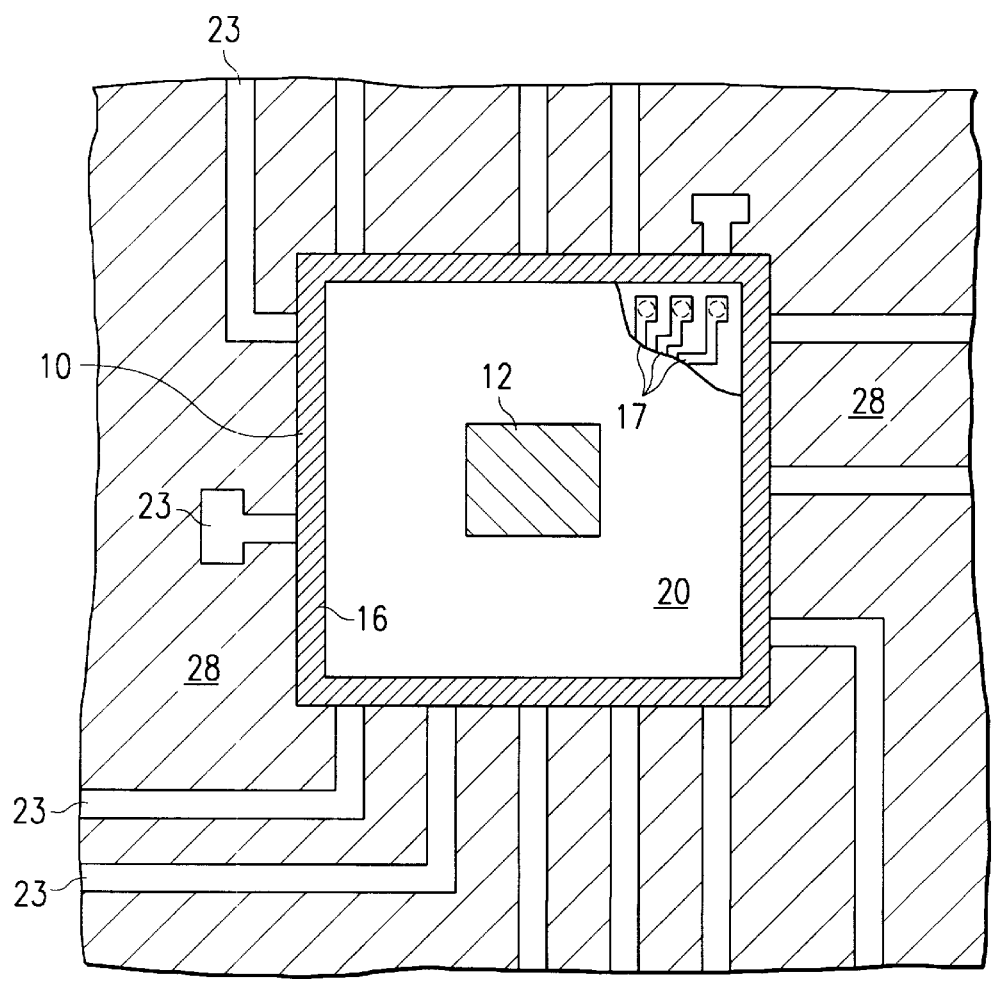
FIG. 1B is a plan view of the integrated circuit package according to FIG. 1A, including a cutaway portion.

Referring now to FIGS. 1A–1B and 2A–2B, packaged integrated circuit 10 according to a first preferred embodiment of the invention will now be described in detail. While the following description is provided using the example of a package containing a single integrated circuit chip, it is of course to be understood that the present invention is also applicable to the packaging or mounting of multiple integrated circuit chips to a board, for example in a hybrid integrated circuit or multichip module.

The active element of packaged integrated circuit 10 is semiconductor chip 12, which is a solid-state integrated circuit device such as a microprocessor, memory, logic device, analog device or other electronic function implemented in a single-chip integrated circuit, as known in the art. According to this embodiment of the invention, chip 12 is attached on its bottom (inactive) surface to conductive slug 14, mounted within and below the plane of substrate 16.

Substrate 16 may be a ceramic substrate, printed circuit board, or other similar substrate having conductors 17 upon or within the substrate (see FIG. 1B) for carrying electrical signals to and from chip 12, and having an opening or receptacle therein within which the conductive slug 14 is mounted. Bond wires 18 connect conductors 17 to bond pads on chip 12 in the conventional manner. Plated-through vias 22 make connection between conductors 17 on the top surface of substrate 16 and solder balls 24 on the lower surface of substrate 16. According to this embodiment of the invention, solder balls 24 are arranged in the conventional ball-grid-array manner around conductive slug 14, and correspond to lands or other surface conductors 23 (see FIG. 1B) on the top surface of system circuit board 28 (see FIG. 2A) to which packaged integrated circuit 10 is to be mounted. Encapsulant 20, formed of a plastic mold compound, an epoxy, a potting compound, or other conventional integrated circuit encapsulant, covers chip 12 and wires 18 to provide environmental and mechanical protection.

Conductive slug 14 is preferably formed of a material with high thermal conductivity, so that heat from chip 12 may be readily conducted therethrough. In addition, if electrical connection is to be made to chip 12, conductive slug 14 is also preferably electrically conductive. The preferred material for conductive slug 14 is believed to be copper, but other materials known in the art to be thermally conductive and, if desired, electrically conductive, may alternatively be used for slug 14.

Solder balls 24 are also disposed in an array manner beneath and in contact with substrate 16. Slug 14 and solder balls 24 are capable of conducting heat away from chip 12. Slug 14 may be connected to a ground plane within system circuit board 28 (see FIG. 2A). The ground plane may be biased to ground or another substrate bias voltage, in which case slug 14 will also provide proper grounding for chip 12. While packaged integrated circuit 10, according to this embodiment of the invention, is shown in FIG. 2A as attached to system circuit board 28, it is to be understood by those of ordinary skill in the art that packaged integrated circuit 10 will often be individually manufactured and sold, with the purchaser performing the installation of packaged integrated circuit 10 to system circuit board 28 in a computer or other end equipment.

The fabrication of packaged integrated circuit 10 begins with the insertion of slug 14 into the corresponding cavity of substrate 16; slug 14 is preferably epoxied into this cavity for mechanical integrity. Chip 12 is then mounted to the top surface of slug 14 by conventional die attach techniques, such as a conductive epoxy or eutectic mount. Bond wires 18 are then attached between substrate 16 and chip 12 by conventional techniques, such as thermocompression or ultrasonic bonding. Upon completion of the wire bond process, encapsulant 20 is formed over chip 12 and wires 18 in the conventional manner. In the example of FIG. 1A, encapsulate 20 is formed by conventional transfer molding; alternatively, encapsulant 20 may be "globbed" over chip 12 and substrate 16 by dispensation and curing, in the conventional manner. Solder balls 24 are formed on the underside of substrate 24, in the conventional manner, for example, by way of a solder mask (not shown) on the underside of substrate 16.

Figure 2A:
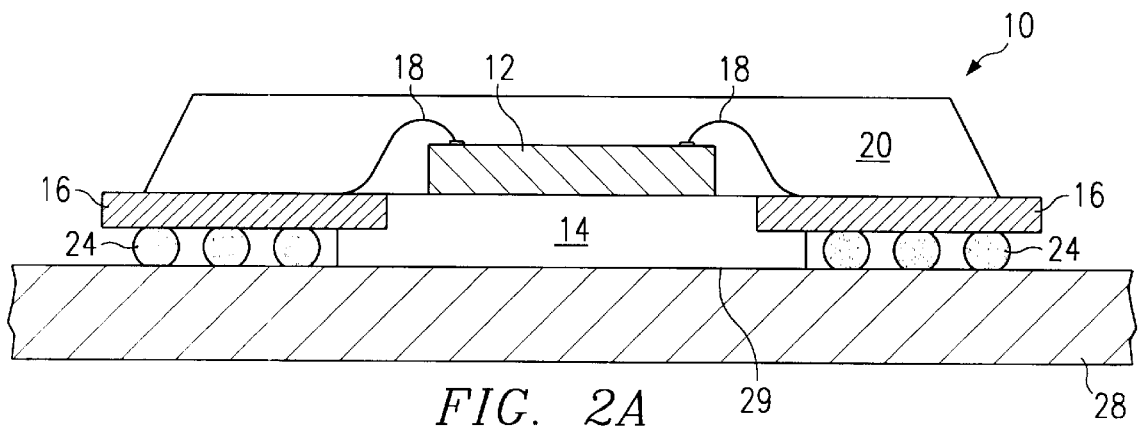
Figure 2B:
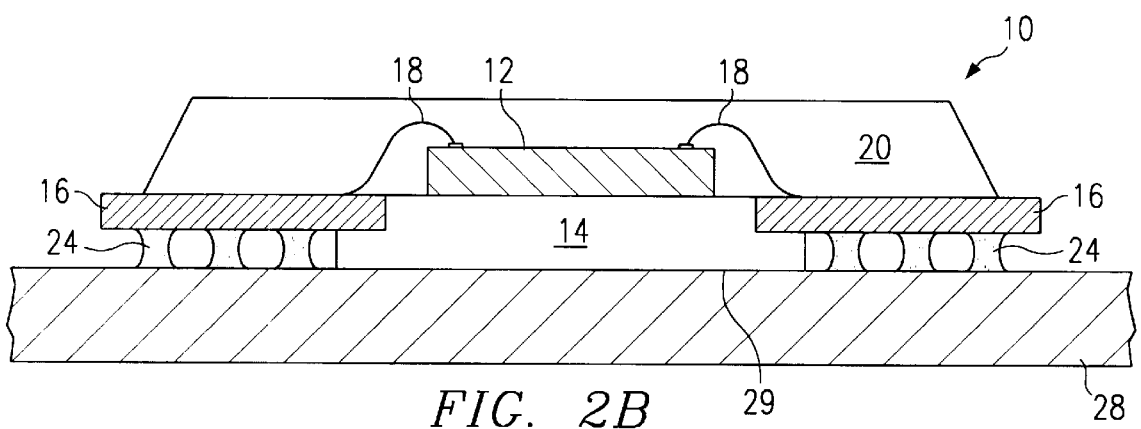

Upon completion of the construction of packaged integrated circuit 10, and any desired electrical testing in packaged form, packaged integrated circuit 10 is ready for mounting to system circuit board 28 (see FIG. 2A). Mounting of packaged integrated circuit 10 is preferably done by way of IR reflow or other conventional technique for the surface mounting of BGA packages to circuit boards. In addition, conductive slug 14 may have a plated region 15 on the underside region at interface 29 between the slug 14 and system circuit board 28. Plated region 15 will create a wettable surface during reflow which will bond to system circuit board 28 maximizing the area of thermal conduction from chip 12 to system circuit board 28. This thermal conduction path will enable system circuit board 28 to behave as a heat sink. Conductive slug 14 may be plated with conventional materials such as tin or nickel or other appropriate plating material. Alternatively, due to process variations, during reflow a small air gap or void may remain between slug 14 and system circuit board 28 without substantially impairing the ability of slug 14 to provide a thermal conduction path from chip 12 to system circuit board 28.

Conductive slug 14 will serve as a stand-off during solder reflow of solder bumps 24. As shown in FIG. 1A, the specific collapse distance 26 of the solder bumps is determined by the height of conductive slug 14 below the plane of substrate 16. The shape of the solder bumps 24 after reflow will be determined by the starting volume of solder and the collapse distance 26. The shape of solder bumps 24 after reflow, by way of example, may remain substantially circular (see FIG. 2A) or may result in an hour-glass shape (see FIG. 2B). The hour-glass shape may be more desirable and may be optimized according to the specific collapse distance 26 and starting volume of solder.

Figure 3:
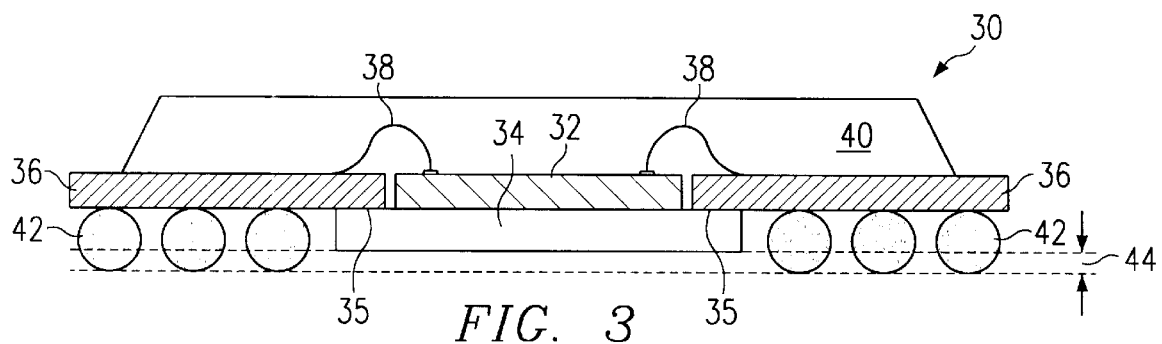
FIGS. 3–4 are cross-sectional illustrations of an integrated circuit package according to an alternative preferred embodiment of the present invention.
Figure 4:
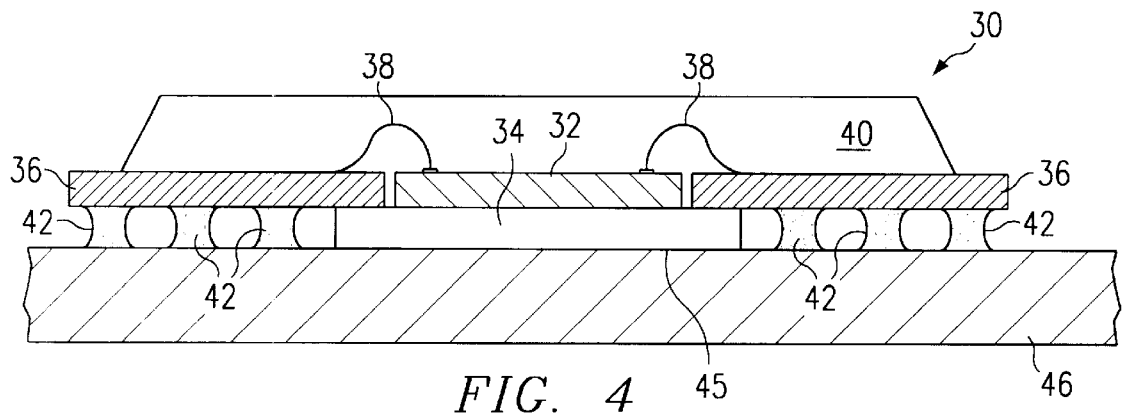

FIGS. 3 and 4 illustrate, in cross-section, packaged integrated circuit 30 according to a second embodiment of the invention. According to this embodiment of the invention, packaged integrated circuit 30 includes chip 32 mounted upon thermally conductive slug 34. Slug 34 lies below the plane of substrate 36 and is attached to the underside of substrate 36 at locations 35 providing a lateral surface of substrate 36 to which slug 34 may be epoxied or otherwise securely fastened. In this arrangement, an opening is provide through substrate 36, to which chip 32 is mounted. This construction allows for a reduced height of the overall package and provides for the maximum area for the arrangement of bond wire lands on substrate 36 with minimum wire length, while maximizing the surface area of thermal conduction on the underside.

Bond wires 38 electrically connect conductors (not shown) in substrate 36 to pads on the surface of chip 32. In this embodiment of the invention, encapsulant 40 is disposed over the cavity of substrate 36, and thus over chip 32 and wires 38. Encapsulant 40, according to this embodiment of the invention, is dispensed by way of a syringe or other liquid dispenser, and is then cured in a conventional manner for so-called "chip-on-board" construction.

Solder balls 42 are attached to lands on the bottom of substrate 36 around thermally conductive slug 34. Vias (not shown) are provided within substrate 36 to provide electrical connection to the conductors in the substrate. A solder mask (not shown) may be provided on the underside of substrate 36 to aid in defining the location of solder balls 42, during the attachment in the conventional manner.

As in the first embodiment discussed hereinabove, packaged integrated circuit 30 is attached to system circuit board 46 (see FIG. 4) by way of infrared (IR) solder reflow or other conventional surface mount technique. Solder balls 42 and slug 34 may connect to a thermal conductor within system circuit board 46, thus providing a path of relatively low thermal resistance between chip 32 and system circuit board 46.

As described above with reference to the preferred embodiment, conductive slug 34 will serve as a stand-off during the solder reflow of solder bumps 42. The shape of the solder bumps after reflow will be determined by the volume of solder before reflow and the specific collapse distance 44 (see FIG. 3). In addition, the underside of slug 34 may be plated to create a wettable surface during reflow at the interface 45 between slug 34 and system circuit board 46 to form a strong bond and enhance the thermal conduction from chip 32 to system circuit board 46.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A packaged integrated circuit, comprising:
    a substrate having first and second surfaces, and having an opening disposed therethrough, and having a plurality of electrical conductors;
    a slug, comprised of a thermally conductive material and having first and second surfaces, the first surface of the slug lying below the plane of the first surface of the substrate, wherein a portion of the second surface of the slug is connected to the first surface of the substrate, the remaining portion of the second surface of the substrate being exposed in the opening;
    an integrated circuit chip, mounted to the exposed second surface of the slug, and electrically connected to the conductors of the substrate; and
    a plurality of solder balls disposed at the first surface of the substrate and in electrical connection with the conductors of the substrate, for making electrical connection to a circuit board;
    wherein the slug extends below the plane of the first surface of the substrate by a distance selected to define a desired shape for the plurality of solder balls when the integrated circuit package is mounted to the circuit board.

2. The packaged integrated circuit of claim 1, wherein the second surface of the slug has first and second levels;
    wherein a portion of the slug extends through the opening in such a manner that the second level of the second surface is substantially planar with the second surface of the substrate.

3. The packaged integrated circuit of claim 1, further comprising:
    an encapsulant, disposed over the integrated circuit chip, a portion of the second surface of the substrate, and a portion of the second surface of the slug.

4. The packaged integrated circuit of claim 5, wherein the encapsulant comprises molded plastic.

5. The packaged integrated circuit of claim 1, wherein the substrate comprises a printed circuit board.

6. The packaged integrated circuit of claim 1, wherein the substrate comprises a ceramic substrate.

7. The packaged integrated circuit of claim 1, wherein the slug comprises copper.

8. The packaged integrated circuit of claim 1, wherein the desired shape for each of the plurality of solder balls is substantially round.

9. The packaged integrated circuit of claim 1, wherein the desired shape for each of the plurality of solder balls is substantially hourglass.

10. The packaged integrated circuit of claim 1, further comprising:
    a plated region on the first surface of the conductive slug.

* * * * *